United States Patent
Song

(10) Patent No.: US 7,285,467 B2
(45) Date of Patent: Oct. 23, 2007

(54) METHODS OF FABRICATING STATIC RANDOM ACCESS MEMORIES (SRAMS) HAVING VERTICAL TRANSISTORS

(75) Inventor: Seung-Heon Song, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/705,945

(22) Filed: Feb. 13, 2007

(65) Prior Publication Data

US 2007/0155085 A1 Jul. 5, 2007

Related U.S. Application Data

(62) Division of application No. 10/745,216, filed on Dec. 23, 2003, now Pat. No. 7,193,278.

(30) Foreign Application Priority Data

Jan. 7, 2003 (KR) ............................... 2003-00735

(51) Int. Cl.
*H01L 21/8234* (2006.01)
*H01L 21/336* (2006.01)
*H01L 21/3205* (2006.01)
*H01L 21/4763* (2006.01)

(52) U.S. Cl. ...................... 438/279; 438/275; 438/587; 438/637

(58) Field of Classification Search ........ 438/257–279, 438/287–292, 585–588, 637–649, 672
See application file for complete search history.

(56) References Cited

U.S. PATENT DOCUMENTS

| | | | |
|---|---|---|---|
| 5,394,358 A | 2/1995 | Huang | |
| 5,396,100 A | 3/1995 | Yamasaki et al. | |
| 6,417,545 B1 | 7/2002 | Sakaguchi | |
| 6,569,742 B1 | 5/2003 | Taniguchi et al. | |
| 7,109,126 B2 * | 9/2006 | Chakihara et al. | 438/672 |
| 7,179,737 B2 * | 2/2007 | Nishida et al. | 438/649 |

* cited by examiner

*Primary Examiner*—Cuong Nguyen
(74) *Attorney, Agent, or Firm*—Nyers Bigel Sibley & Sajovec PA

(57) ABSTRACT

Unit cells of a static random access memory (SRAM) are provided including an integrated circuit substrate and first and second active regions. The first active region is provided on the integrated circuit substrate and has a first portion and a second portion. The second portion is shorter than the first portion. The first portion has a first end and a second end and the second portion extends out from the first end of the first portion. The second active region is provided on the integrated circuit substrate. The second active region has a third portion and a fourth portion. The fourth portion is shorter than the third portion. The third portion is remote from the first portion of the first active region and has a first end and a second end. The fourth portion extends out from the second end of the third portion towards the first portion of the first active region and is remote from the second portion of the first active region. Methods of forming SRAM cells are also described.

13 Claims, 18 Drawing Sheets

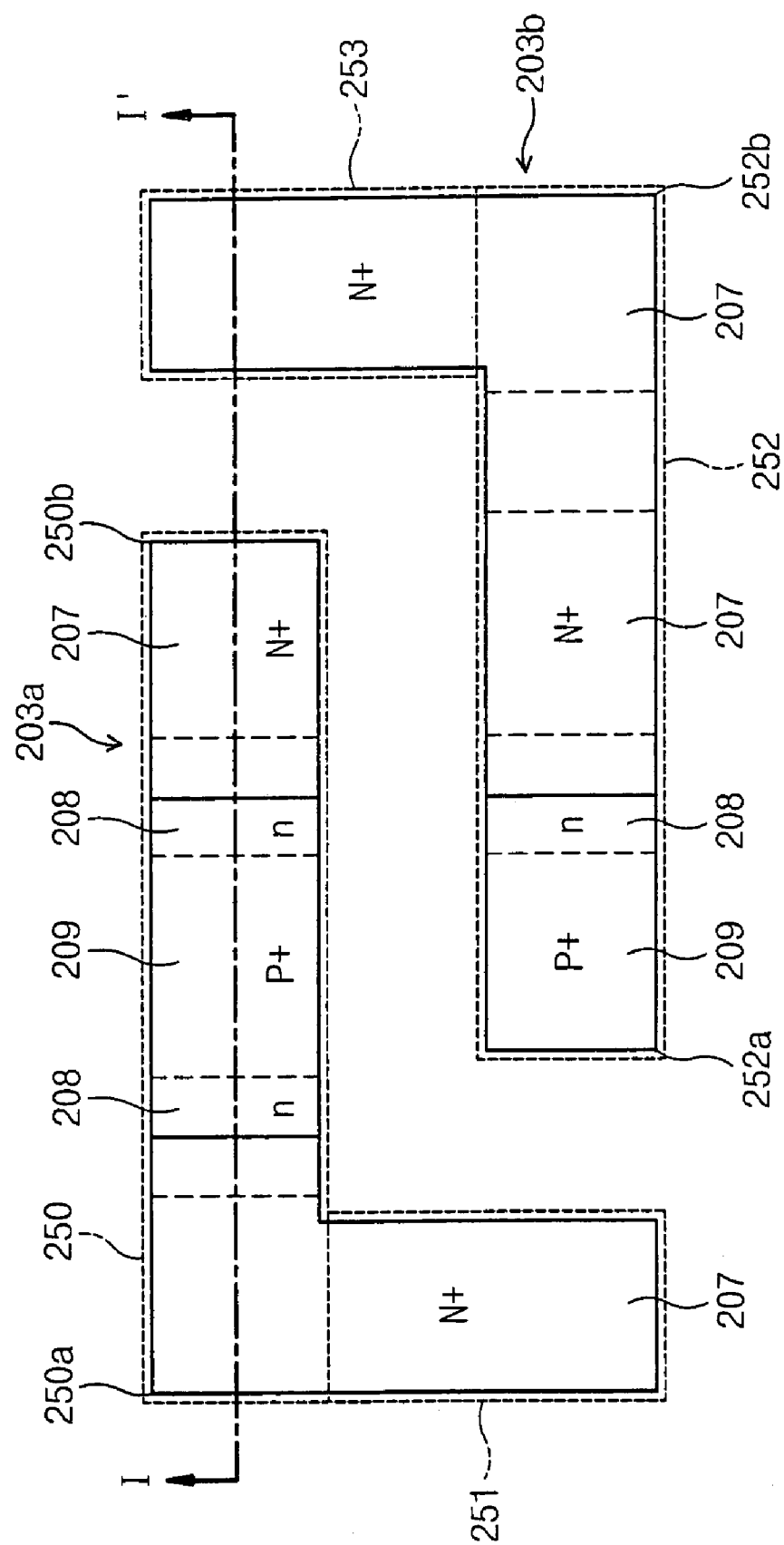

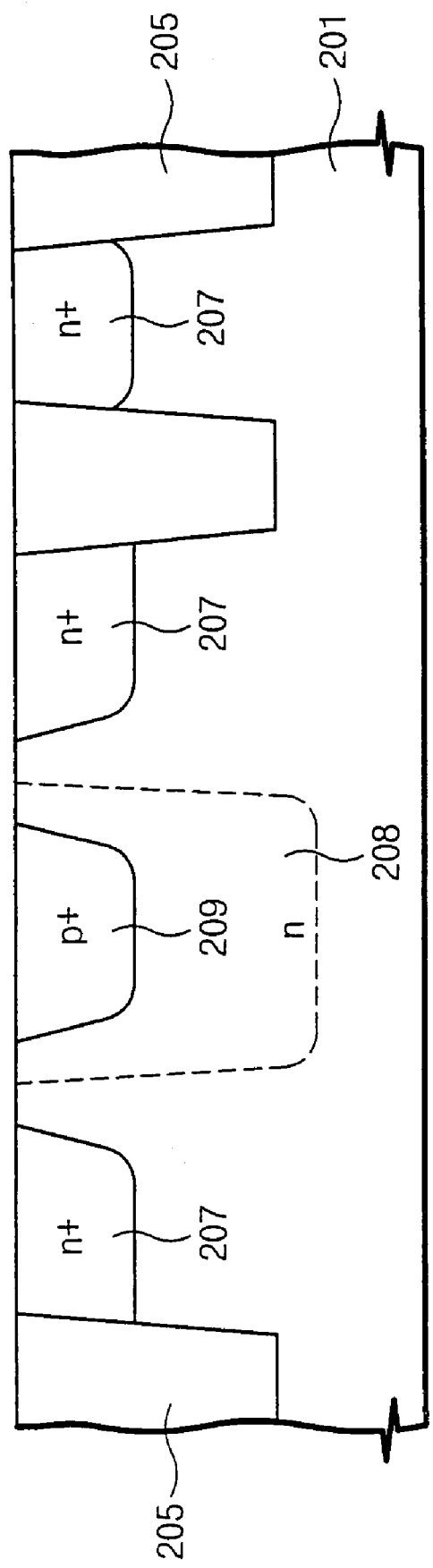

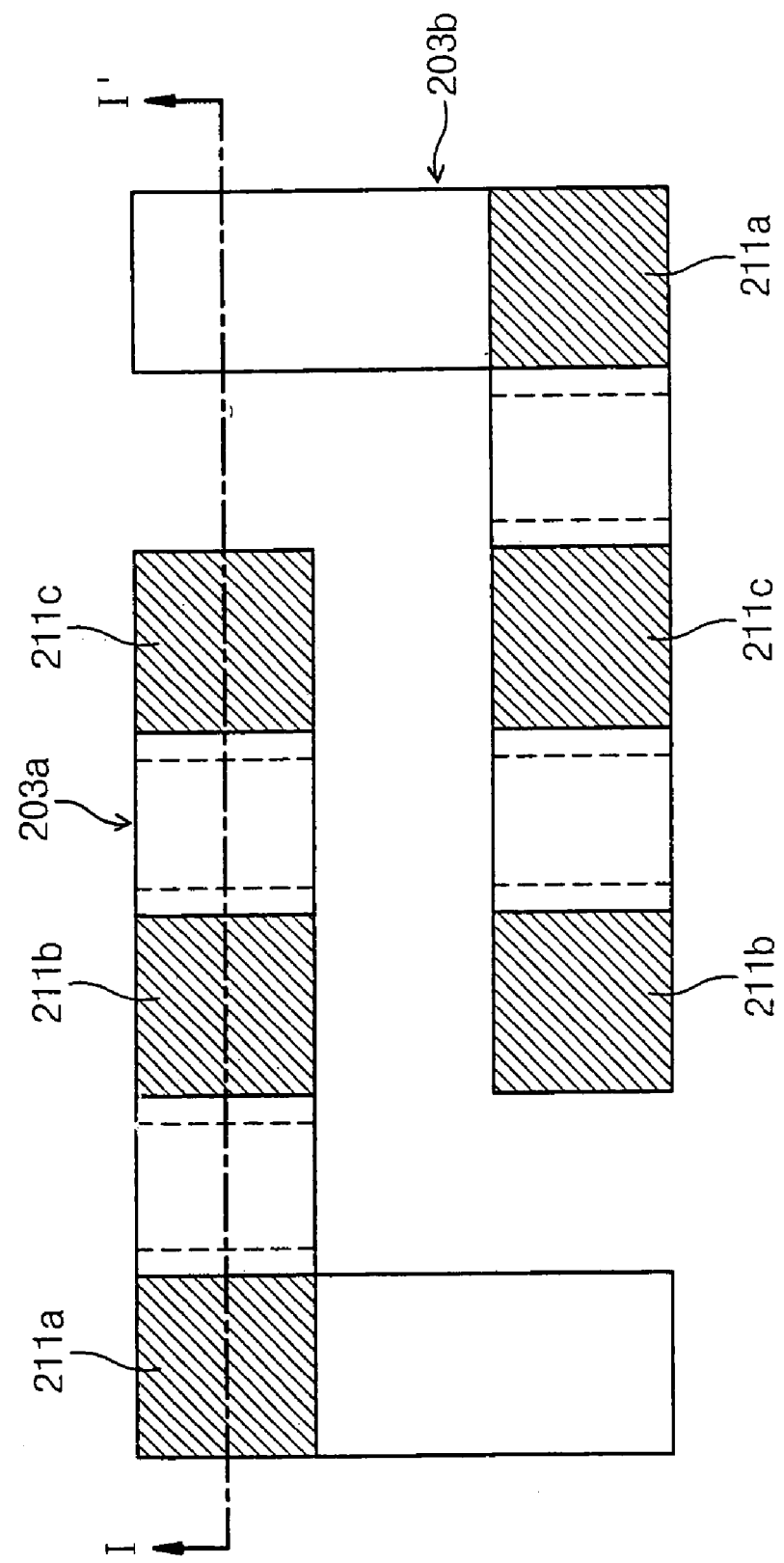

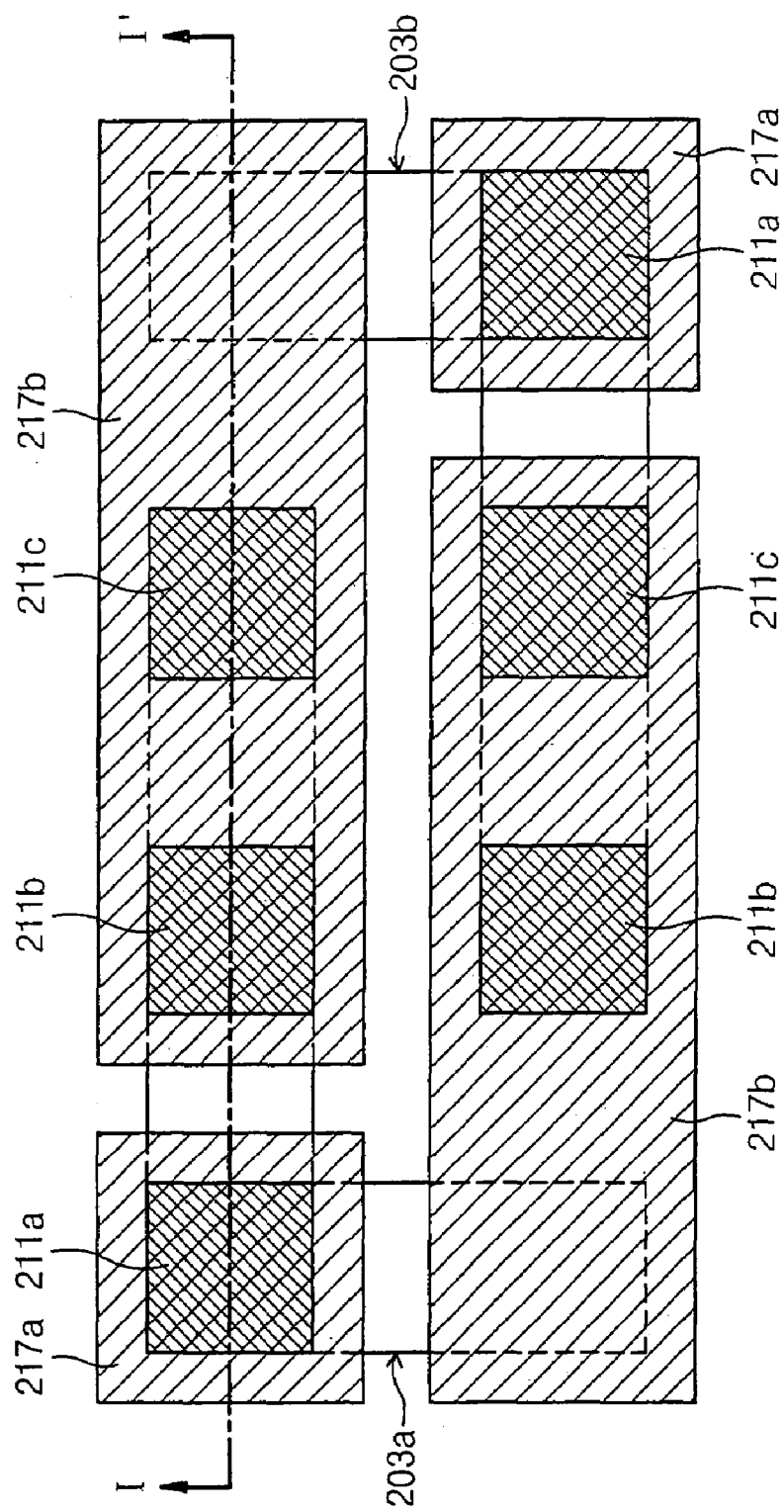

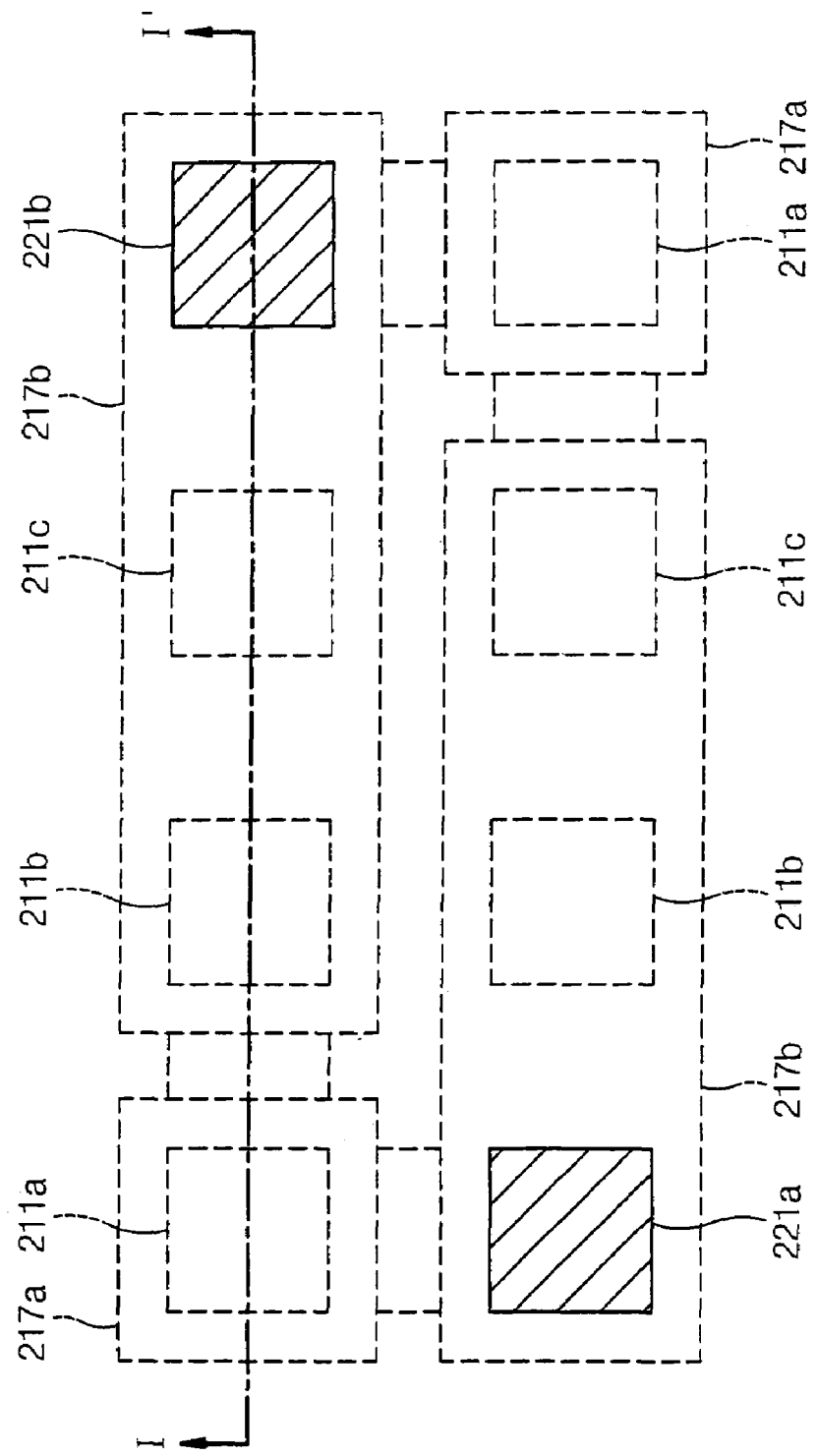

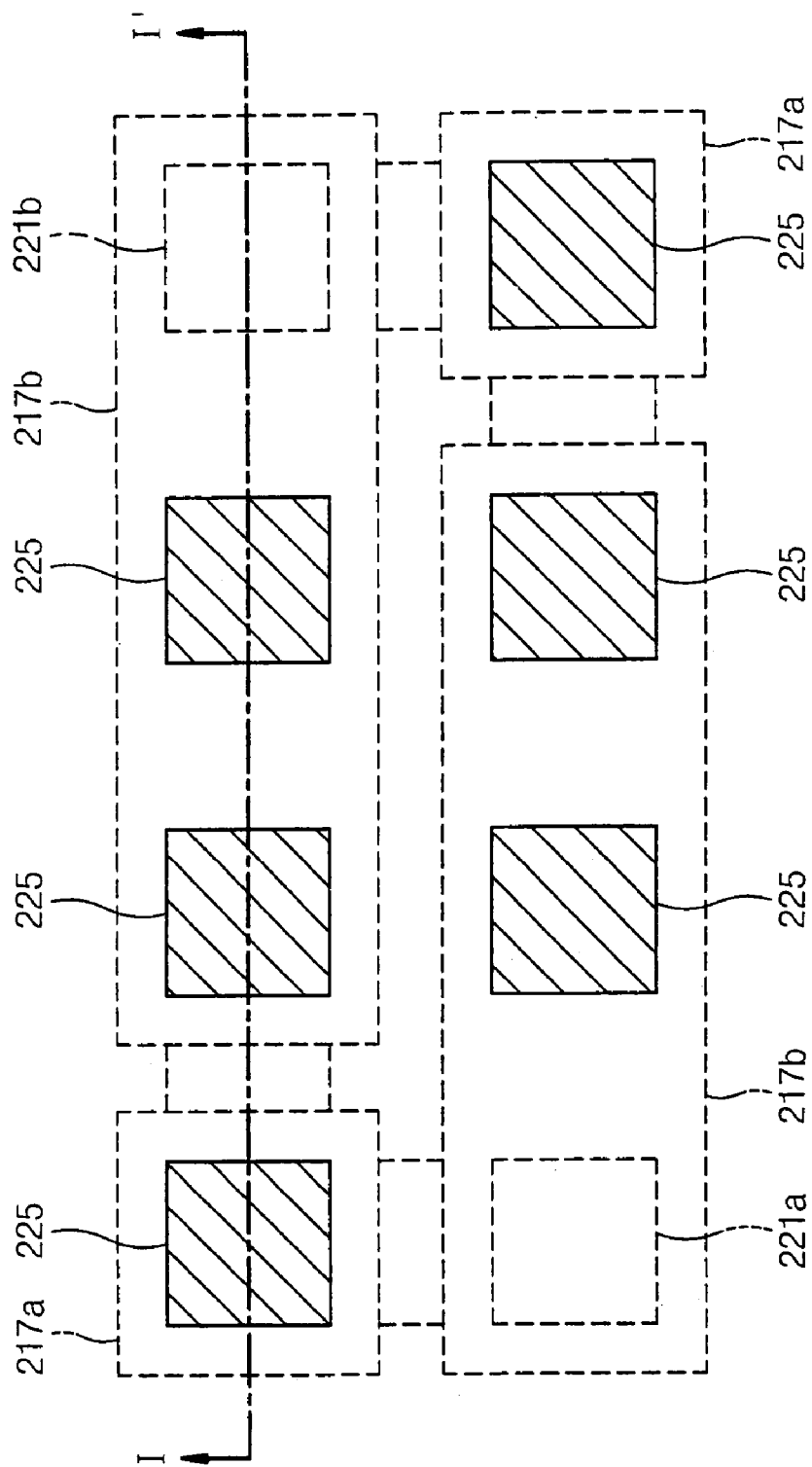

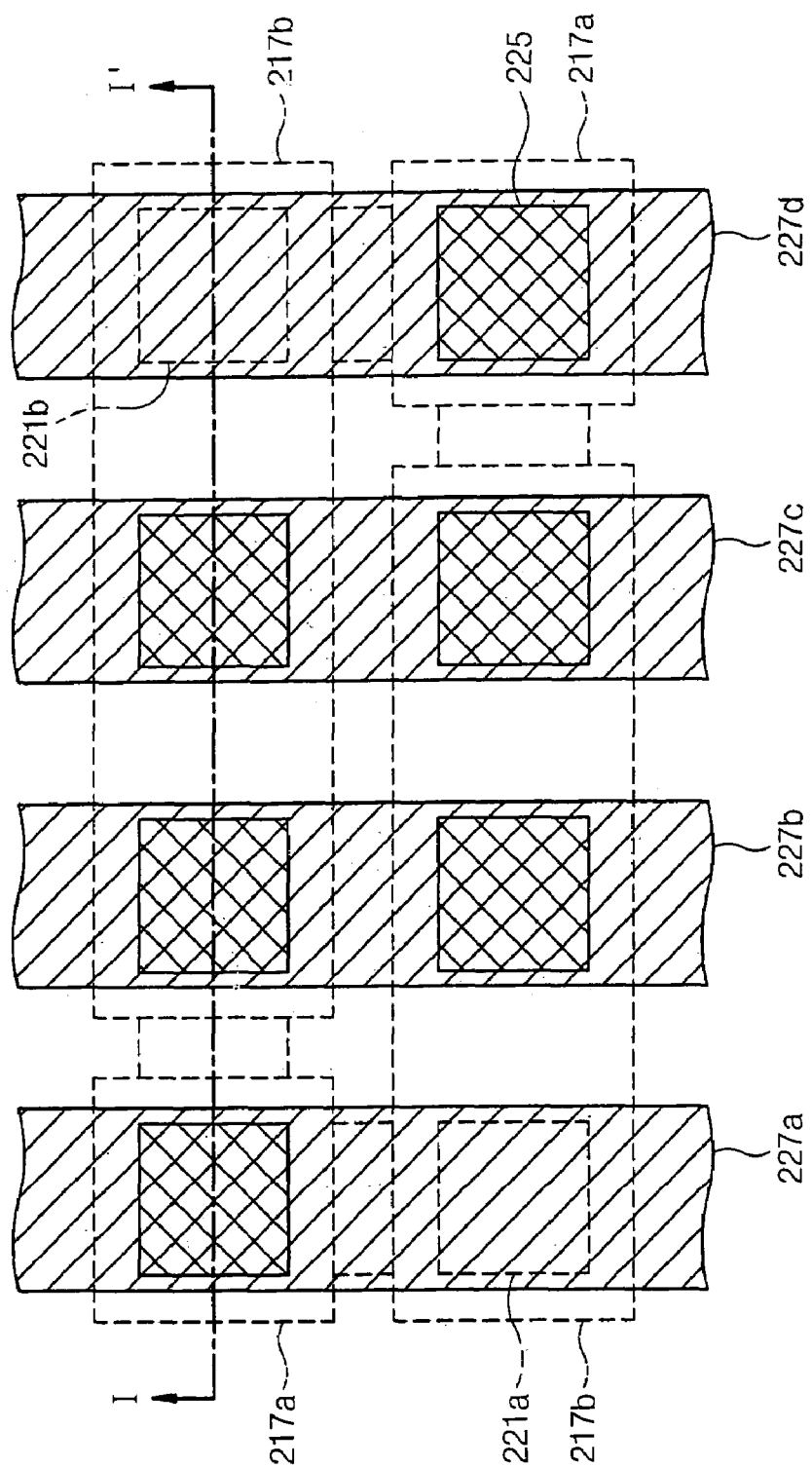

METHODS OF FABRICATING STATIC RANDOM ACCESS MEMORIES (SRAMS) HAVING VERTICAL TRANSISTORS

RELATED APPLICATIONS

This application is a divisional application of and claims priority to U.S. patent application Ser. No. 10/745,216, filed Dec. 23, 2003, now U.S. Pat. No. 7,193,278 which claims priority from Korean Patent Application No. 2003-00735 filed on Jan. 7, 2003 the disclosures of which are hereby incorporated herein by reference as if set forth in their entirety.

FIELD OF THE INVENTION

The present invention relates to integrated circuit devices and methods of fabricating the same and, more particularly, to static random access memories (SRAMs) and methods of fabricating the same.

BACKGROUND OF THE INVENTION

Static random access memory (SRAM) cells are typically composed of two inverters. SRAM cells have a flip-flop structure in which the input/output ports of the inverters are cross-coupled. Typically only four transistors are used to store information in the SRAM cell, however, two additional transistors can be connected thereto to select a desired cell from outside the cell. Unlike a dynamic random access memory (DRAM), an SRAM can retain static data without a refresh operation.

FIG. 1 is a circuit diagram of a conventional SRAM cell and FIG. 2 illustrates a planar view of a conventional SRAM cell, which is symmetrical along the k-k'. As illustrated in FIG. 1, the SRAM cell includes first and second access transistors $AT_1$, and $AT_2$, first and second pull-up transistors $PT_1$ and $PT_2$, and first and second driver transistors $DT_1$, and $DT_2$.

The first pull-up transistor $PT_1$ and the first driver transistor $DT_1$ compose a first inverter. Similarly, the second pull-up transistor $PT_2$ and the second driver transistor $DT_2$ compose a second inverter. As illustrated, the first and second inverters are crossed coupled to first and second nodes N1 and N2, respectively.

Source regions of the first and second driver transistors $DT_1$ and $DT_2$ are connected to a ground line voltage $V_{SS}$. The source regions of the first and second pull-up transistors $PT_1$ and $PT_2$ are connected to a power line voltage $V_{DD}$. A drain of the first access transistor AT1 is connected to a first bit line BL1. A drain of the second access transistor $AT_2$ is connected to a second bit line BL2. Sources of the first and second access transistors $AT_1$, and $AT_2$ are connected to first and second nodes N1 and N2, respectively. Gate electrodes of the first and second access transistors are connected to a common word line WL.

Referring now to FIG. 2, a field oxide layer 106 is formed on the integrated circuit substrate to define first and second active regions 102a and 102b. Gate layers 115, 117a and 117b cross over the field oxide layer 106 and the active regions 102a and 102b. The gate layers 115, 117a and 117b compose a word line 115 and first and second gate electrodes 117a and 117b. The word line 115 crosses over the first active region 102a and forms gates of the first and second access transistors $AT_1$, and $AT_2$.

As illustrated in FIG. 2, the first gate electrode 117a is orthogonal to the first word line 115. The first gate electrode 117a crosses over the first and second active regions 102a and 102b to form gates of the first driver transistor $DT_1$ and the first pull-up transistor $PT_1$ and to connect the gates of the first driver transistor $DT_1$, and the first pull-up transistor $PT_1$. The second gate electrode 117b is parallel to the first gate electrode 117a. The second gate electrode 117b crosses over the first and second active regions 102a and 102b to form gates of the second driver transistor $DT_2$ and the second pull-up transistor $PT_2$ and to connect the gates of the second driver transistor $DT_2$ and the second pull-up transistor to the $PT_2$.

An $N^+$ type impurity-doped region 124 is formed in the first active region 102a among the gate layers 115, 117a and 117b by implanting highly doped $N^+$ type impurity ions. A $P^+$ type impurity-doped region 125 is formed in the second active region 102b between the gate layers 117a and 117b by implanting highly doped $P^+$ type impurity ions.

The $N^+$ type impurity-doped region 124 between the first access transistor AT1 and the first driver DT1 becomes the first node N1. The first node N1 is connected to a first common connection line (not shown) through a contact CT2a. The first common connection line is connected to a drain of the first pull-up transistor $PT_1$ through a contact CT5a and to the gates of the second driver transistor $DT_2$ and the second pull-up transistor $PT_2$ through a contact CT3b.

The $N^+$ type impurity-doped region 124 between the second access transistor $AT_2$ and the second driver transistor $DT_2$ becomes the second node N2. The second node N2 is connected to a second common connection line (not shown) through a contact CT2b. The second common connection line is connected to a drain of the second pull-up transistor PT2 through a contact CT5b and to the gates of the first driver transistor DT1 and the first pull-up transistor $PT_1$ through a contact CT3a.

Contacts CT1a and CT1b connect the drains of the first and second access transistors $AT_1$ and $AT_2$ to the first and second bit lines BL1 and BL2 (not shown), respectively. A contact CT4 connects the sources of the first and second pull-up transistors $PT_1$ and $PT_2$ to the power line voltage $V_{DD}$ (not shown). A contact CT6 connects the sources of the first and second driver transistors $DT_1$ and $DT_2$ to the ground line voltage $V_{SS}$ (not illustrated).

A conventional SRAM typically operates at high speeds and consumes a relatively small amount of power. However, a unit cell of a conventional SRAM may occupy a large area, which may be a problem in highly integrated devices. Furthermore, as SRAM devices become more highly integrated, a channel length of a transistor in the SRAM may be decreased as a result of an increasing leakage current. The increase in the leakage current may further result in increasing a standby current. Accordingly, it may become more difficult to provide an SRAM that consumes a relatively small amount of power. Thus, improved SRAMs may be desired.

SUMMARY OF THE INVENTION

Embodiments of the present invention provide unit cells of a static random access memory (SRAM) including an integrated circuit substrate and first and second active regions. The first active region is provided on the integrated circuit substrate and has a first portion and a second portion. The second portion is shorter than the first portion. The first portion has a first end and a second end and the second portion extends out from the first end of the first portion. The second active region is provided on the integrated circuit substrate. The second active region has a third portion and a fourth portion. The fourth portion is shorter than the third portion. The third portion is remote from the first portion of the first active region and has a first end and a second end. The fourth portion extends out from the second end of the third portion towards the first portion of the first active region and is remote from the second portion of the first active region.

In some embodiments of the present invention, the first portion of the first active region may be perpendicular to the second portion of the first active region and parallel to the third portion of the second active region. The third portion of the second active region may be perpendicular to the fourth portion of the second active region. The second portion of the first active region may be parallel to the fourth portion of the second active region. A field oxide layer on the integrated circuit substrate may define the first and second active regions.

Further embodiments of the present invention may include first, second, third and fourth N-type impurity-doped regions and first and second P-type impurity-doped regions. The first N-type impurity-doped region may be disposed in the first portion of the first active region at the second end of the first portion and the second N-type impurity-doped region may be disposed in the second portion of the first active region. The third N-type impurity-doped region is provided in the third portion of second active region between the first and second ends of the third portion and the fourth N-type impurity-doped region is provided in the fourth portion of the second active region. The first P-type impurity-doped region is provided in the first portion of the first active region between the first end and the second end of the first portion and adjacent the first N-type impurity doped region and the second P-type impurity-doped region is provided in the third portion of the second active region at the first end of the second active region adjacent the third N-type impurity doped region.

In still further embodiments of the present invention, the first N-type impurity-doped region and third N-type impurity-doped region may be aligned and the first P-type impurity-doped region and second P-type impurity-doped region may be aligned.

Some embodiments of the present invention may include first through sixth pillars. The first and second pillars may be provided on the first and third N-type impurity-doped regions, respectively, the third and fourth pillars may be provided on the second and fourth N-type impurity-doped regions, respectively, and the fifth and sixth pillars are provided on the first and second P-type impurity-doped region, respectively.

Further embodiments of the present invention may include a first gate electrode on sidewalls of the third and fourth pillars a second gate electrode on sidewalls of the first, second, fourth and fifth pillars. In certain embodiments, first, second, third and fourth N-type pillar impurity-doped regions may be provided in an upper portion of first, second, third and fourth pillars and fifth and sixth P-type pillar impurity doped regions may be provided in an upper portion of the fifth and sixth pillars.

While the present invention is described above primarily with reference integrated circuit devices, methods of fabricating integrated circuit devices are also provided herein.

BRIEF DESCRIPTION OF THE DRAWINGS

FIGS. 3A through 10A are planar views of SRAM cells illustrating processing steps in the fabrication of SRAM cells having vertical transistors according to embodiments of the present invention.

FIGS. 3B through 10B are cross sections of SRAM cells taken along the line I-I' of FIGS. 3A through 10A, respectively, illustrating processing steps in the fabrication of SRAM cells according to embodiments of the present invention.

DETAILED DESCRIPTION

Figure 1:
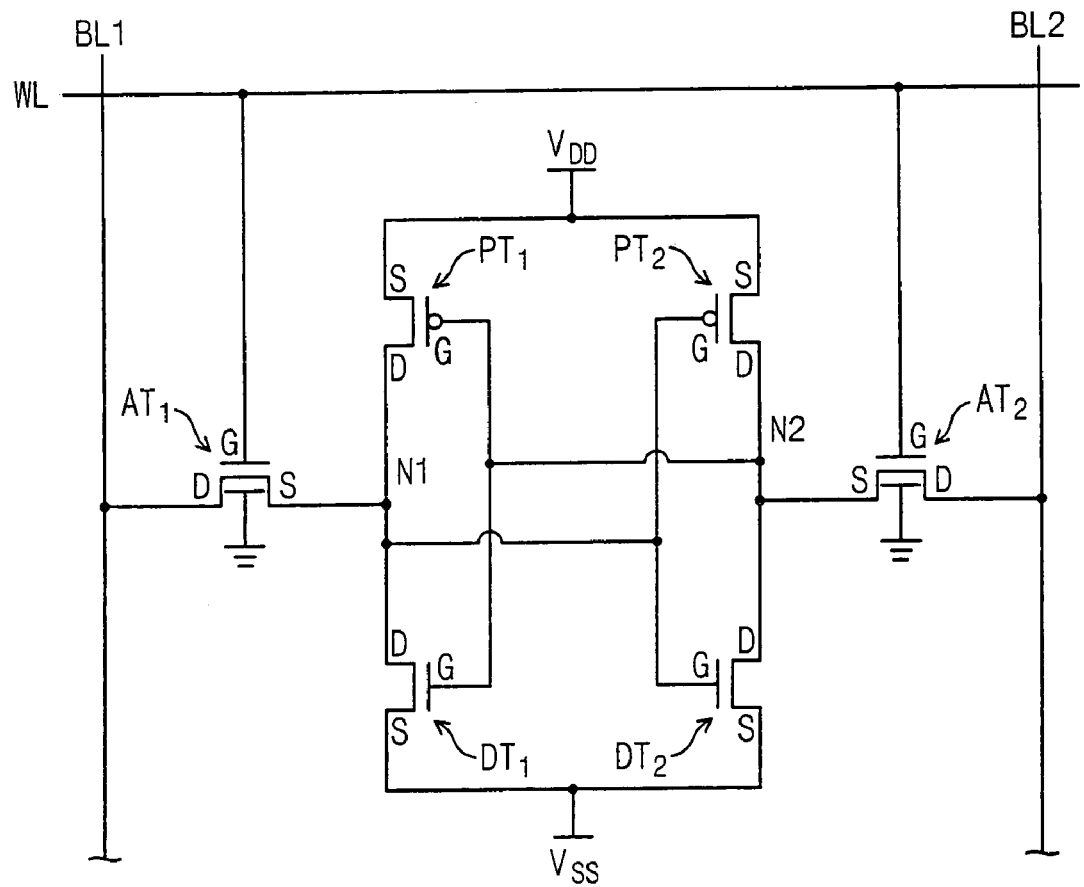
FIG. 1 is a circuit diagram of conventional static random access memory (SRAM) cells.
Figure 2:
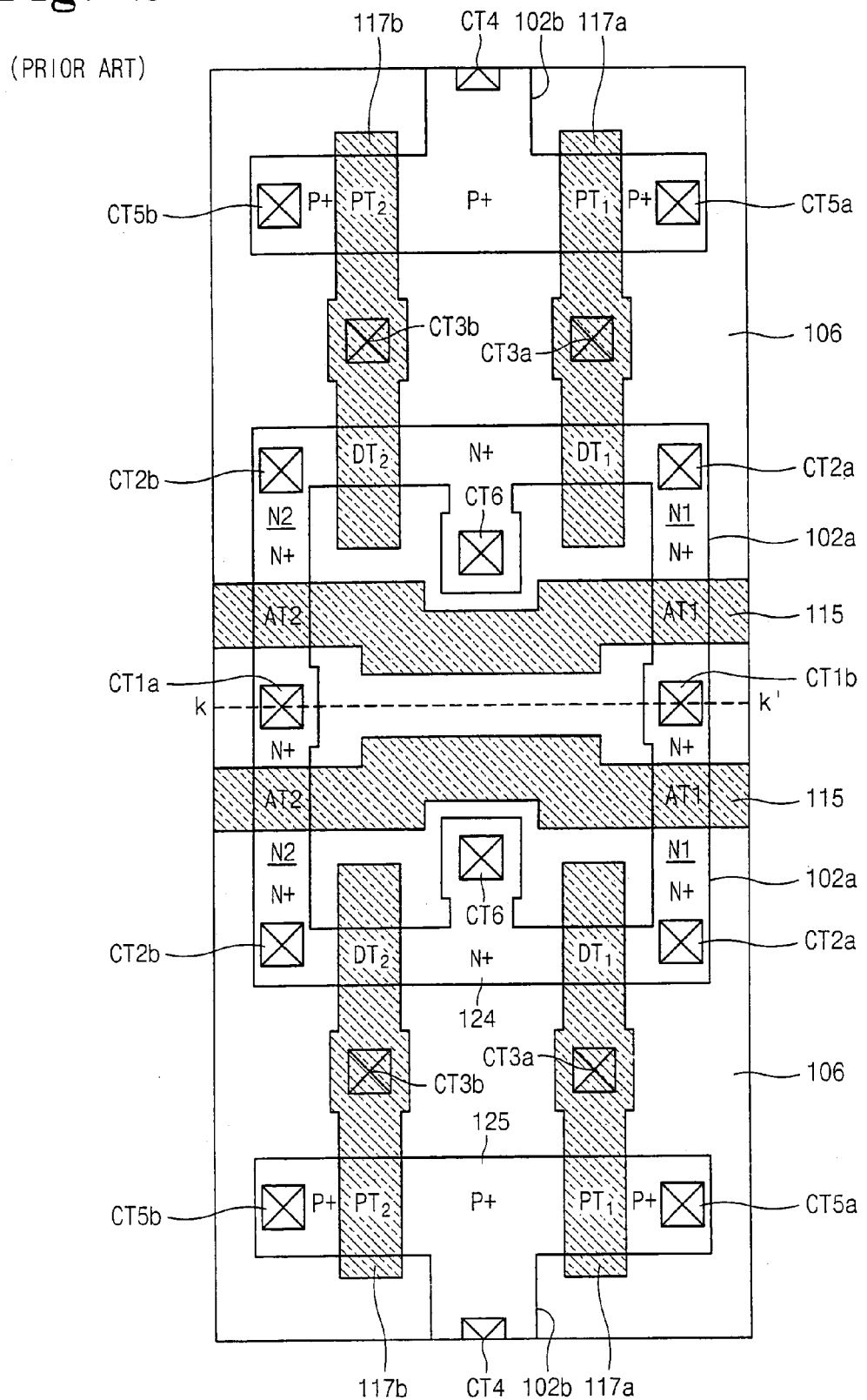
FIG. 2 is a planar view of conventional SRAM cells.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" or "beneath" another element, it can be directly under the other element or intervening elements may also be present. It will be understood that when part of an element is referred to as "outer," it is closer to the outside of the integrated circuit than other parts of the element. Like numbers refer to like elements throughout.

Furthermore, relative terms, such as beneath, may be used herein to describe an element's relationship to another as illustrated in the Figures. It will be understood that these terms are intended to encompass different orientations of the elements in addition to the orientation depicted in the Figures. For example, if a Figure is inverted, the elements described as "beneath" other elements would be oriented "above" these other elements. The relative terms are, therefore, intended to encompass all possible arrangements of the elements and not just the ones shown in the Figures.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 3A through 10B. Embodiments of the present invention provide static random access memory (SRAM) cells and methods of fabricating the same. SRAM cells according to embodiments of the present invention include active regions having an L shape that may allow the SRAM cells to have a vertical structure, thus, possibly decreasing the overall area occupied by the SRAM cell. Accordingly, SRAM cells according to embodiments of the present invention may be suitable for highly integrated devices without sacrificing power consumption as discussed further below.

FIGS. 3A through 10A are planar views of SRAM cells illustrating processing steps in the fabrication of SRAM cells having vertical transistors according to embodiments of the present invention. FIGS. 3B through 10B are cross-sectional views taken along I-I' lines of FIGS. 3A through 10A, respectively and illustrate processing steps in the fabrication of SRAM cells according to embodiments of the present invention.

Referring now to FIGS. 3A and 3B, a field oxide layer 205 is formed on a P-type integrated circuit substrate 201 to define a first active region 203a and a second active region 203b. In particular, the integrated circuit substrate 201 is selectively etched to form a trench. An insulation material is provided in the trench and, for example, a chemical mechanical polishing (CMP) process is performed to form a field oxide layer 205. The first active region 203a may have a planar shape of L composed of first and second portions 250 and 251. Furthermore, a second active region 203b may have an inverted planar L shape as illustrated in FIG. 3A. The second active region 203b may also have first and second portions 252 and 253 similar to the first active region 203a.

An N$^+$ type impurity-doped region 207 is formed on regions of the first and second active regions 203a and 203b by selectively implanting N$^+$ type impurity ions. As used herein, "N$^+$" or "P$^+$" refer to regions that are defined by higher carrier concentrations, i.e. more highly doped, than are present in adjacent or other regions of the same or another layer or substrate. The first active region 203a has first and second portions 250 and 251. The second portion 251 may be shorter than the first portion 250 as illustrated in FIG. 3A. The first portion has first and second ends 250a and 250b. The second portion 251 may extend out from the first end 250a of the first portion 250 to form an "L" shape. The second active region 203b has first and second portions 252 and 253. The second portion 253 may be shorter than the first portion 252 as illustrated in FIG. 3A. The first portion has first and second ends 252a and 252b. The second portion 253 may extend out from the second end 252b of the first portion 252 towards the first portion 250 of the first active region 203a and may form an "L" shape. It will be understood that the "L" shapes of the first and second active regions 203a and 203b illustrated in FIG. 3A are provided for exemplary purposes only and that embodiments of the present invention should not be limited to this configuration.

In the first active region 203a, the second portion 251 and at least a portion of the second end 250b of the first portion 250 may include N-type impurities to provide N$^+$ type doped-impurity regions 207. In the second active region 203b, the second portion 253 and a middle portion of the first portion 252 may include N-type impurities to provide N$^+$ type impurity-doped regions 207. An n-type well 208 is formed in regions of the first and second active regions 203a and 203b by selectively implanting n-type impurity ions. As discussed above, the n-type region 208 may have a carrier concentration that is less than the carrier concentrations of the N$^+$ regions. P$^+$ type impurity-doped region 209 is formed in the n-type well 208 by selectively implanting P-type impurity ions. In the first active region 203a, the middle part of the first portion 250 may include the P$^+$ type impurity-doped region 209. In the second active region 203b, the first end 252a of the first portion 152 may include the P$^+$ type impurity-doped region 209 as illustrated in FIG. 3A. As further illustrated in FIG. 3A, the N$^+$ type impurity-doped regions 207 in the first and second active regions 203a and 203b are aligned and the P$^+$ type impurity-doped regions 209 in the first and second active regions 203a and 203b are aligned.

Figure 4B:
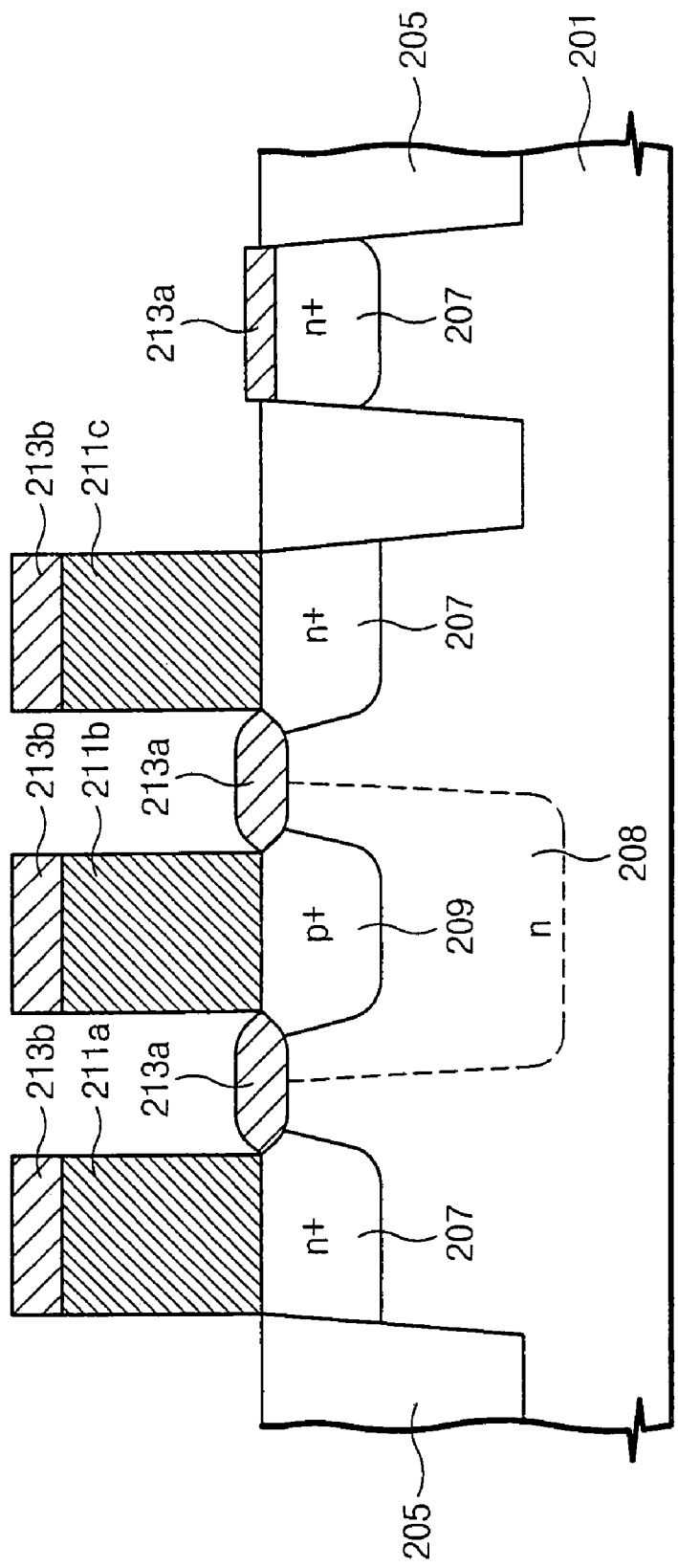

Referring now to FIGS. 4A and 4B, first through sixth pillars 211a, 211b and 211c are formed on the N$^+$ type and P$^+$ type impurity-doped regions 207 and 209 of the first and second active regions 203a and 203c. The first through sixth pillars 211a, 211b and 211c may include, for example, silicon. In some embodiments of the present invention, the first through sixth pillars 211a, 211b and 211c may be grown or deposited and selectively etched. In further embodiments of the present invention, the integrated circuit substrate 201 may be etched to form the pillars 211a, 211b and 211c. The first and second pillars 211a are for an access transistor, the third and fourth pillars 211b are for a pull-up transistor and the fifth and sixth pillars 211c are for a driver transistor. Channel regions of the access transistor, the pull-up transistor and the driver transistor are formed on sidewalls of the first through sixth pillars 211a, 211b and 211c.

As illustrated in FIG. 4A, the edges of the first through sixth pillars 211a, 211b and 211c may be disposed in the N$^+$ type and P$^+$ type impurity-doped regions 207 and 209. The first through sixth pillars 211a, 211b and 211c may include four pillars 211a and 211c on the N$^+$ type impurity-doped regions 207 and two pillars 211b on the P$^+$ type impurity-doped regions 209. Impurity ions may be selectively implanted into the first through sixth pillars 211a, 211b and 211c. In certain embodiments of the present invention, N-type impurity ions may be implanted into the pillars 211b on the P$^+$ type impurity-doped region 209 and P-type impurity ions may be implanted into the pillars 211a and 211c on the P$^+$ type impurity-doped region 207.

An insulation layer (not shown) is formed on a surface of the integrated circuit substrate 201 where the first through sixth pillars 211a, 211b and 211c are formed. The insulation layer may be, for example, anisotropically etched to expose the first through sixth pillars 211a, 211b and 211c and the integrated circuit substrate 201. In some embodiments of the present invention, the insulation layer may remain on the sidewalls of the first through sixth pillars 211a, 211b and 211c as spacers.

As illustrated in FIG. 4B, silicide layers 213a and 213b are formed on the exposed pillars 211a, 211b and 211c and the exposed integrated circuit substrate 201 using a silicide process. The silicide layers 213a and 213b may include, for example, cobalt (Co), titanium (Ti), nickel (Ni), tungsten (W), platinum (Pt), hafnium (Hf), and/or palladium (Pd). In particular, a metal layer is deposited on the surface of the integrated circuit substrate 201 and a rapid thermal annealing process or a thermal process using a furnace is performed to form the silicide layers 213a and 213b. It will be understood that any metal remaining on the spacers formed of the insulation layer may not be changed to a silicide layer. The silicide layers 213a and 213b include the silicide layer 213a on the exposed integrated circuit substrate 201 and the silicide layer 213b on the pillars 211a, 211b and 211c.

A cleaning process is performed by, for example, using a mixed solution of $H_2SO_4$ and $H_2O_2$ with respect to the integrated circuit substrate 201 where the silicide layers 213a and 213b are formed. The cleaning process may remove the metal on the spacers of the insulation layer that did not change to silicide during the silicidation process. The spacers may be removed from the sidewalls of the first through sixth pillars 211a, 211b and 211c.

The silicide layers 213a on the first and second active regions 203a and 203b electrically couple the N$^+$ type and P$^+$ type impurity-doped regions 207 and 209 in the first active region 203a and the N$^+$ type and P$^+$ type impurity-doped regions 207 and 209 in the second active region 203b. In other words, the N$^+$ type and P$^+$ type impurity-doped regions 207 and 209 in the first active region 203a correspond to a first node of an SRAM cell, and the N$^+$ type and P$^+$ type impurity-doped regions 207 and 209 in the second active region 203b correspond to a second node of the SRAM cell.

Figure 5B:
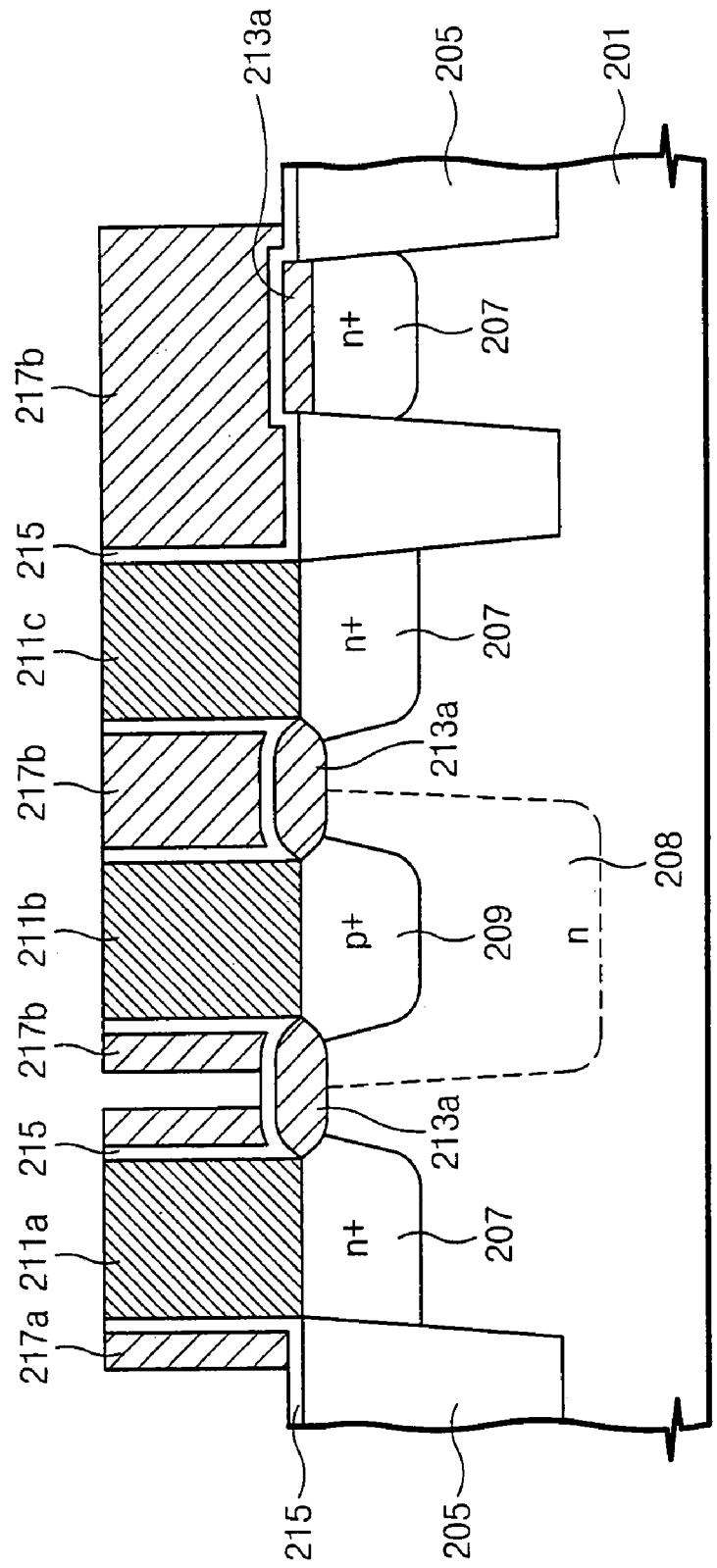

Referring now to FIGS. 5A and 5B, a conformal gate insulator 215 is formed on the surface of the integrated circuit substrate 201 having the silicide layer 213a and 213b. A gate conductive layer formed on the gate insulator to sufficiently cover the first through sixth pillars 211a, 211b and 211c. The gate insulator 215 may include, for example, an oxide and may be formed by, for example, a chemical vapor deposition (CVD) method. The gate conductive layer may include, for example, an impurity-doped polysilicon.

The gate conductive layer is planarized to expose the first through sixth pillars 211a, 211b and 211c. The gate conductive layer, the gate insulator 215 and the silicide layer 213b on the first through sixth pillars 211a, 211b and 211c are successively planarized. The planarization process may be, for example, a chemical mechanical polishing (CMP).

A photolithography process is performed to pattern the planarized gate conductive layer and to form a first gate electrode 217a around the pillar 211a for the access transistor. Simultaneously, second gate electrodes 217b are formed to connect the pillars 211b for the pull-up transistor to the pillars 211c for the driver transistor. The second gate electrode 217b formed on the first active region 203a is extended to the second portion 253 of the second active region 203b. Likewise, the second gate electrode 217b formed on the second active region 203b is extended to the second portion 251 of the first active region 203a.

Figure 6B:
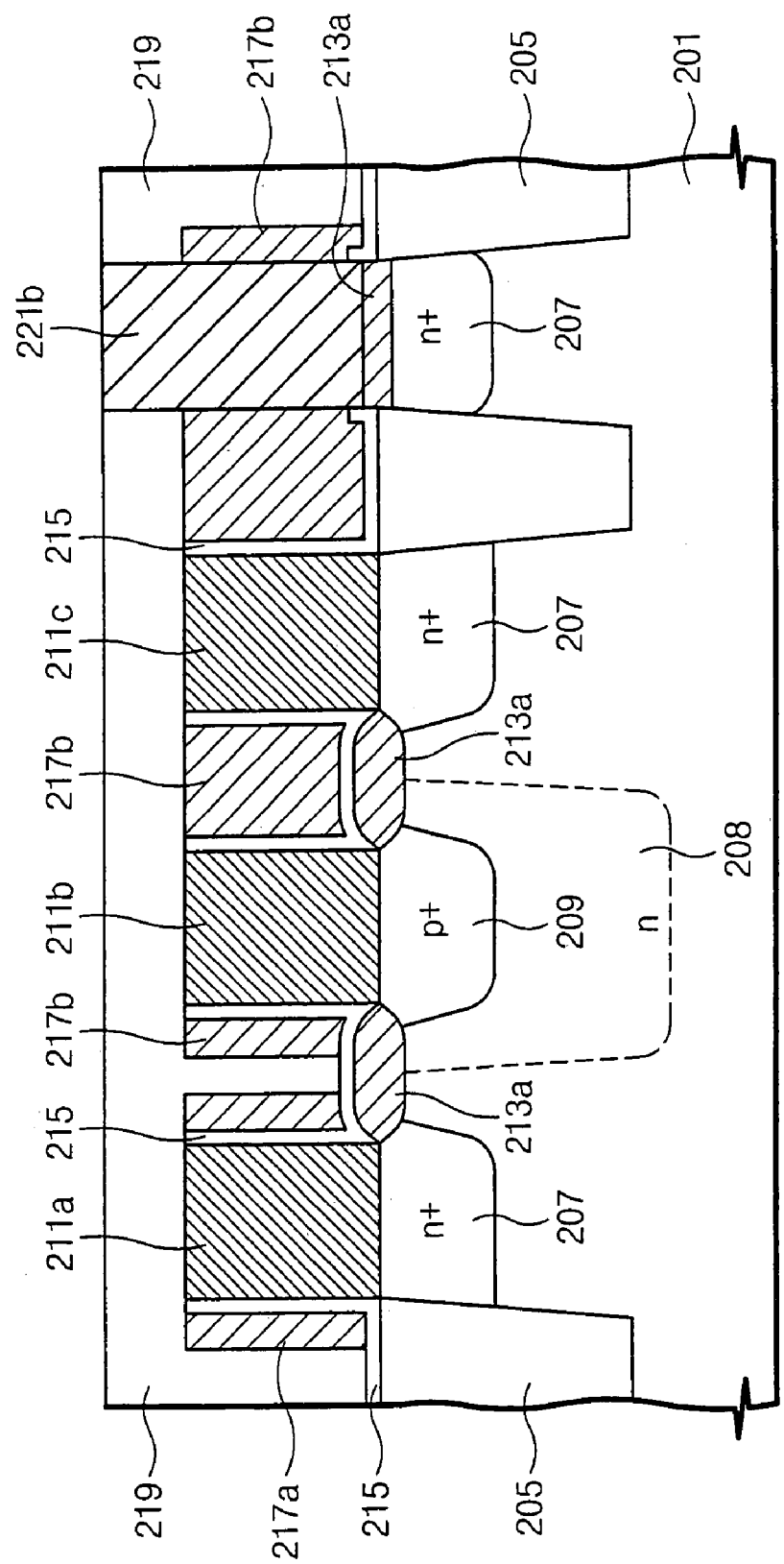

Referring now to FIGS. 6A and 6B, a first interlayer dielectric layer 219 is formed on the structure and between the first through sixth pillars 211a, 211b and 211c and is planarized. The first interlayer dielectric layer 219, the second gate electrode 217b and the gate insulator 215 on the second portions 251 and 253 of the first and second active regions 203a and 203b, respectively, are selectively etched to form contact holes exposing the silicide layers 213a on the second portions 251 and 253 of the first and second active regions 203a and 203b, respectively.

A conductive layer is formed on the structure and in the contact holes and is planarized by, for example, a CMP process to form first and second common connection contacts 221a and 221b. The first and second common connection contacts 221a and 221b are formed on the first and second active regions 203a and 203b, respectively. The first common connection contact 221a on the first active region 203a electrically couples a source region of the access transistor in the first active region 203a to the second gate electrode 217b of the second active region 203b. The second common connection contact 221b formed on the second active region 203b electrically connects a source region of the access transistor in the second active region 203b to the second gate electrode 217b on the first active region 203a. The gates of the pull-up and driver transistors in the first active region 203a are electrically connected to the second node of the second active region 203b, and the gates of the pull-up and driver transistors in the second active region 203a are electrically connected to the first node of the first active region 203a.

In certain embodiments of the present invention, the second gate electrodes 217b may be directly connected to the first and second nodes. In these embodiments, the common connection contacts 221a and 221b may not be necessary. Thus, before forming the gate conductive layer, the gate insulator may be patterned to expose the silicide layer 213a on the second portions 251 and 253 of the first and second active regions 203a and 203b, respectively. A gate conductive layer may be formed on the gate insulator 215 and the exposed silicide layer 213a. The gate conductive layer may be patterned to form the first and second gate electrodes 217a and 217b. Accordingly, the second gate electrode 217b on the first active region 203a is directly connected to the silicide layer 213a on second portion 253 of the second active region 203b. Similarly, the second gate electrode 217b on the second active region 203b is directly connected to the silicide layer 213a on the second portion 251 of the first active region 203a.

Figure 7B:
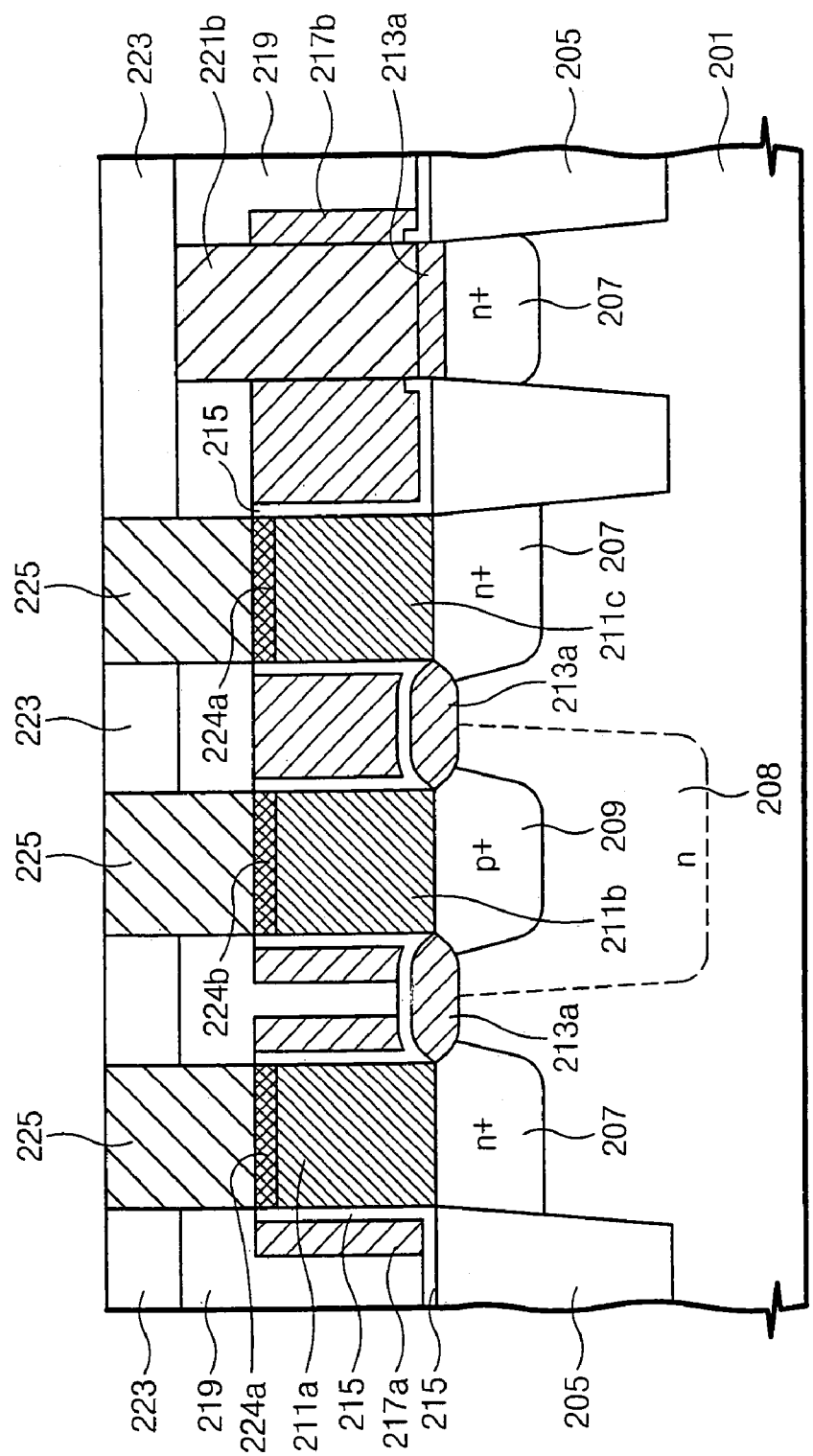

Referring now to FIGS. 7A and 7B, a second interlayer dielectric layer 223 is formed on the first interlayer dielectric layer 219 where the common connection contact 221a and 221b are formed. The second interlayer dielectric layer 223 is selectively etched to form contact holes exposing the first through sixth pillars 211a, 211b and 211c. As illustrated in FIGS. 7A and 7B, the contact holes may be similar in size to the pillars 211a, 211b and 211c. However, in these embodiments, the contact holes may be shorted out from the first and second gate electrodes 217a and 217b if a misalignment occurs during a photolithography process. Accordingly, in certain embodiments of the present invention, the contact holes may be formed to be smaller than the pillars 211a, 211b and 211c to reduce the likelihood of a short.

Impurity ions are selectively implanted into the upper parts of the pillars 211a, 211b and 211c exposed by the contact holes, thereby forming N-type and P-type pillar impurity-doped regions 224a and 224b. The N-type pillar impurity-doped region 224a is formed in the upper part of the pillars 211a and 211c where the access and driver transistors are formed and the P-type pillar impurity-doped region 224b is formed in the upper part of the pillars 211b where the pull-up transistor is formed. The N-type and P-type pillar impurity-doped regions 224a and 224b correspond to a drain region of the access transistor, to a source region of the driver transistor and to a source region of the pull-up transistor.

A conductive layer is formed on the surface of the device and in the contact holes and is planarized by, for example, a CMP process to form contact plugs 225. The conductive layer may include, for example, polysilicon. N-type impurity ions are implanted into the contact plugs 225 on the pillars 211a and 211b for the access transistor and the driver transistor. P-type impurity ions are implanted into the contact plugs 225 on the pillars 211b for the pull-up transistor.

Figure 8B:
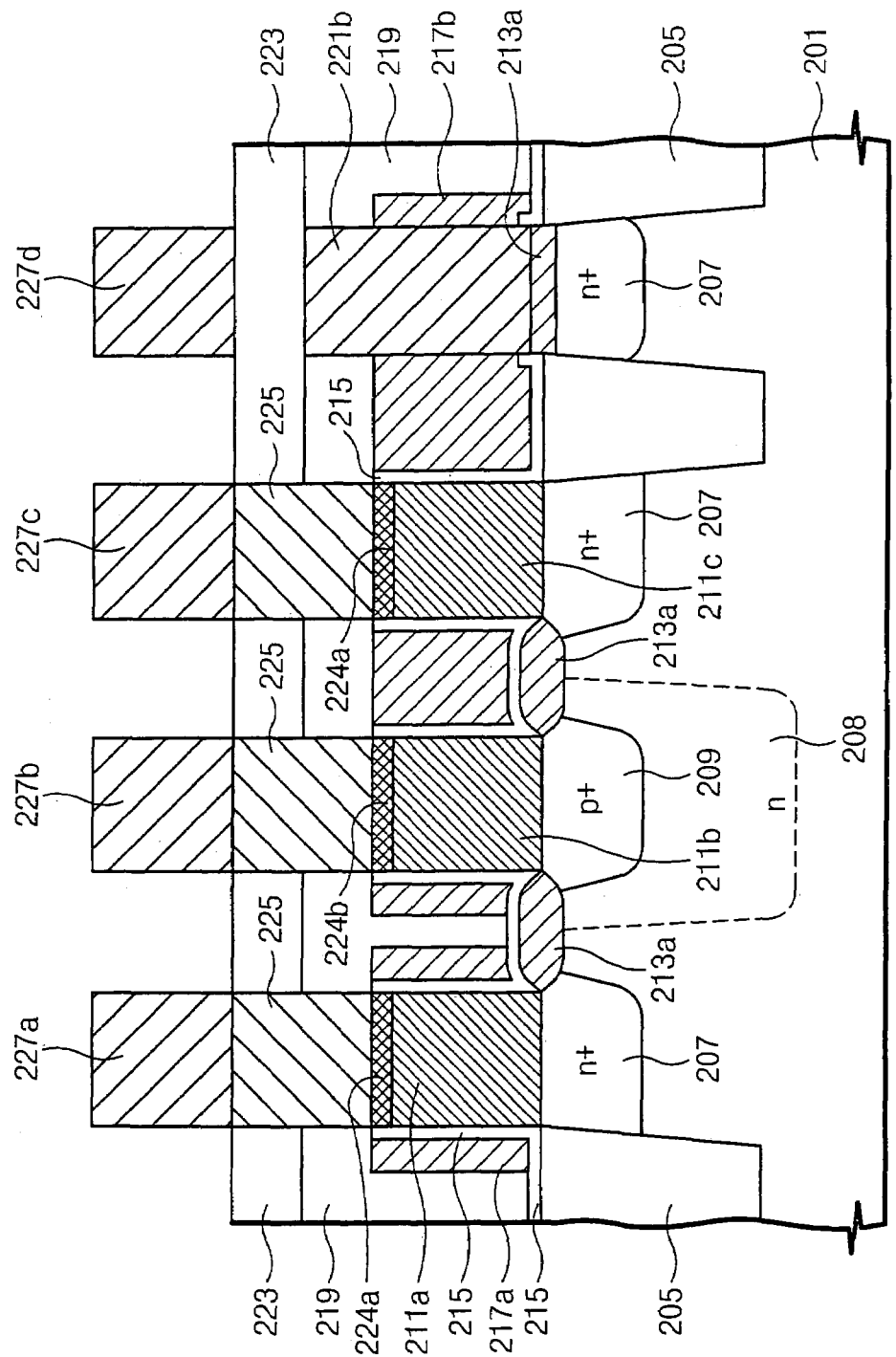

Referring now to FIGS. 8A and 8B, a conductive layer is formed on the second interlayer dielectric layer 223 where the contact plugs 225 are formed. The conductive layer is patterned to form interconnections having line shapes using, for example, a photolithography process. A first interconnection 227a is a first bit line BL1 and is electrically connected to a drain region of the access transistor on the first active region 203a. A second interconnection 227b is a power line voltage $V_{DD}$, and is connected to the source regions of the pull-up transistors on the first and second active regions 203a and 203b. A third interconnection 227c is a ground line voltage $V_{SS}$, and is connected to the source regions of the driver transistors on the first and second active regions 203a and 203b. A fourth interconnection 227d is a second bit line BL2 and is connected to a drain of the access transistor on the second active region 203b.

Figure 9A:
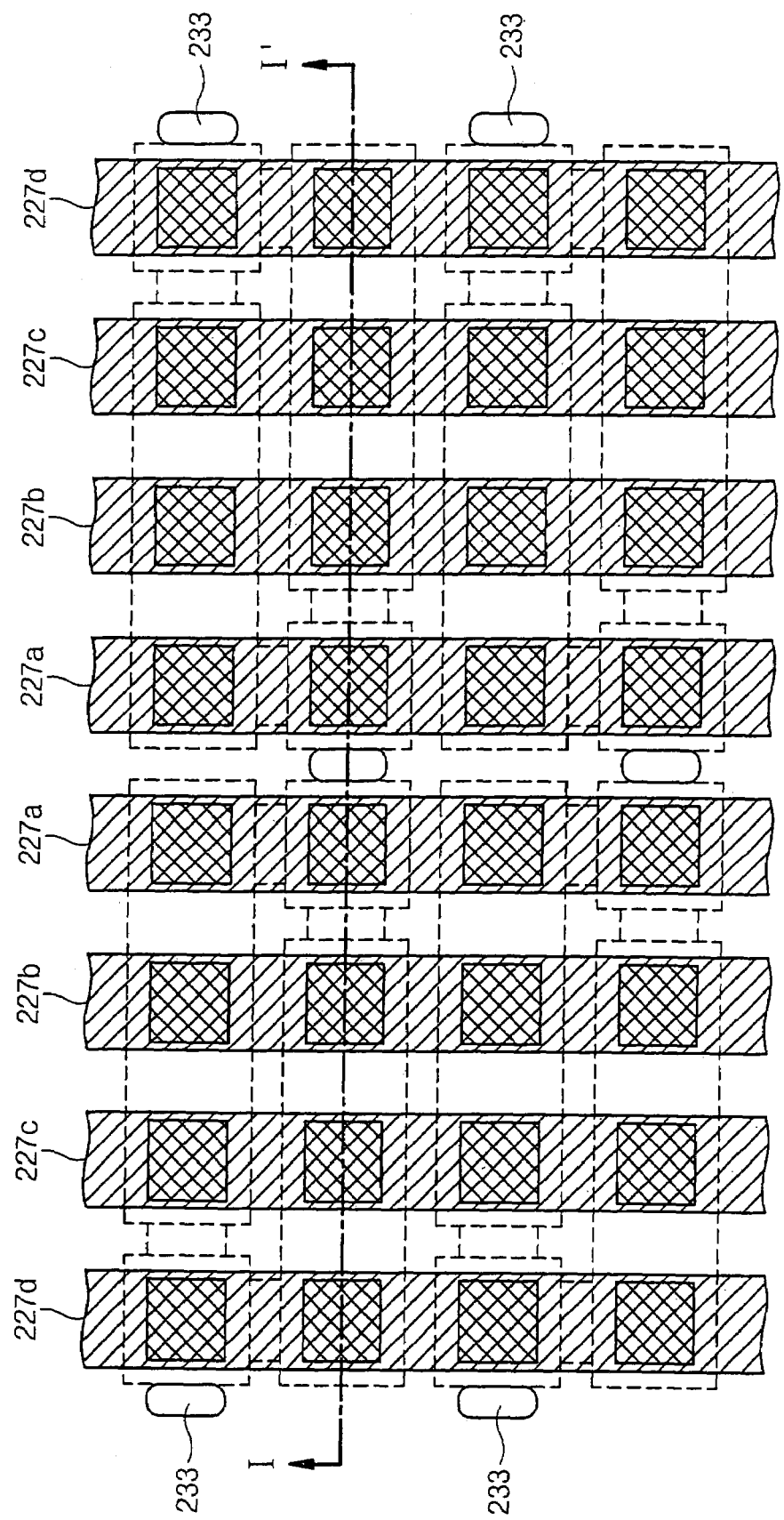
Figure 9B:
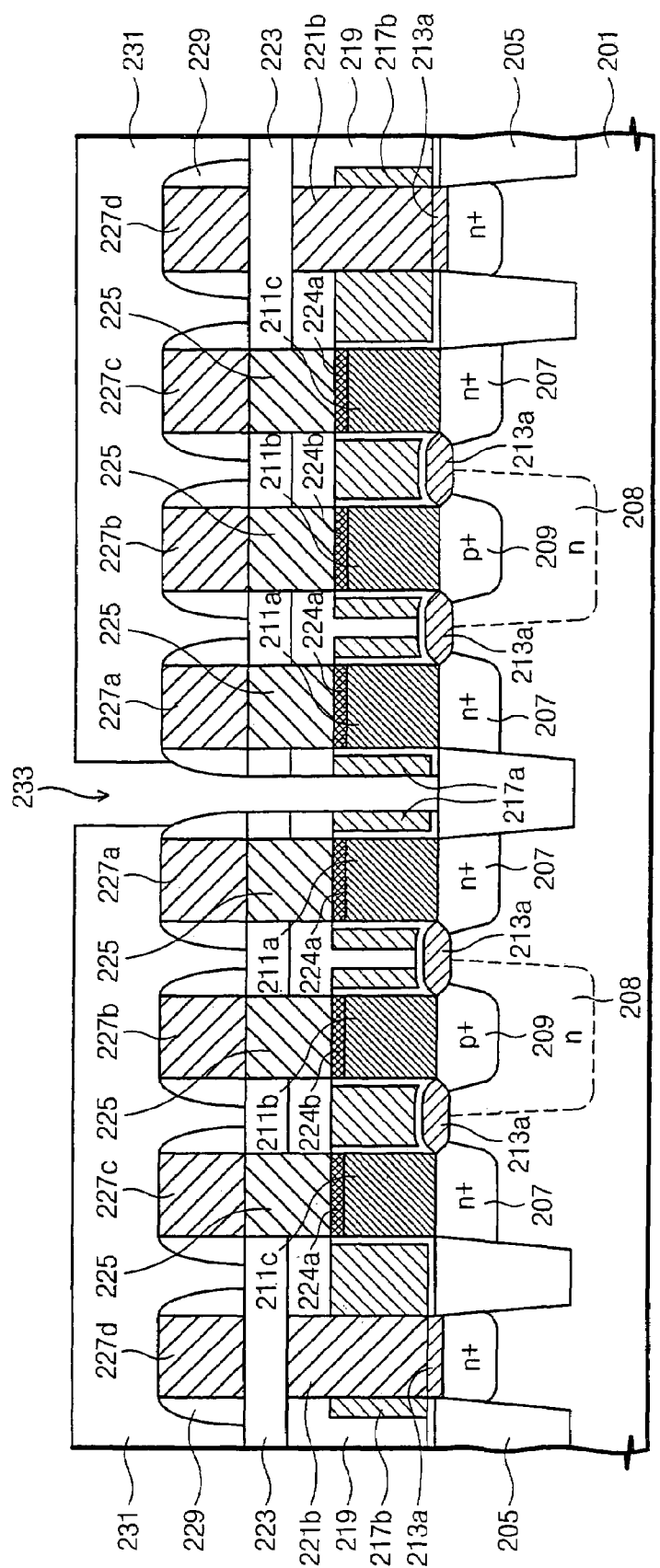

Referring now to FIGS. 9A and 9B, a spacer insulator is formed on the surface of the integrated circuit substrate 201 where the interconnections 227a, 227b, 227c and 227d are formed. The spacer insulator is, for example, anisotropically dry-etched to form spacers 229 on sidewalls of the interconnections 227a, 227b, 227c and 227d. A third interlayer dielectric layer 231 is formed on the a surface of the integrated circuit substrate 201 having the interconnections 227a, 227b, 227c and 227d and the spacers 229.

The first, second and third interlayer dielectric layers 219, 223 and 231 are selectively etched to form contact holes 233 exposing the first gate electrode 217a. The contact hole 233 may be a self-aligned contact hole due to the spacers 229.

Figure 10A:
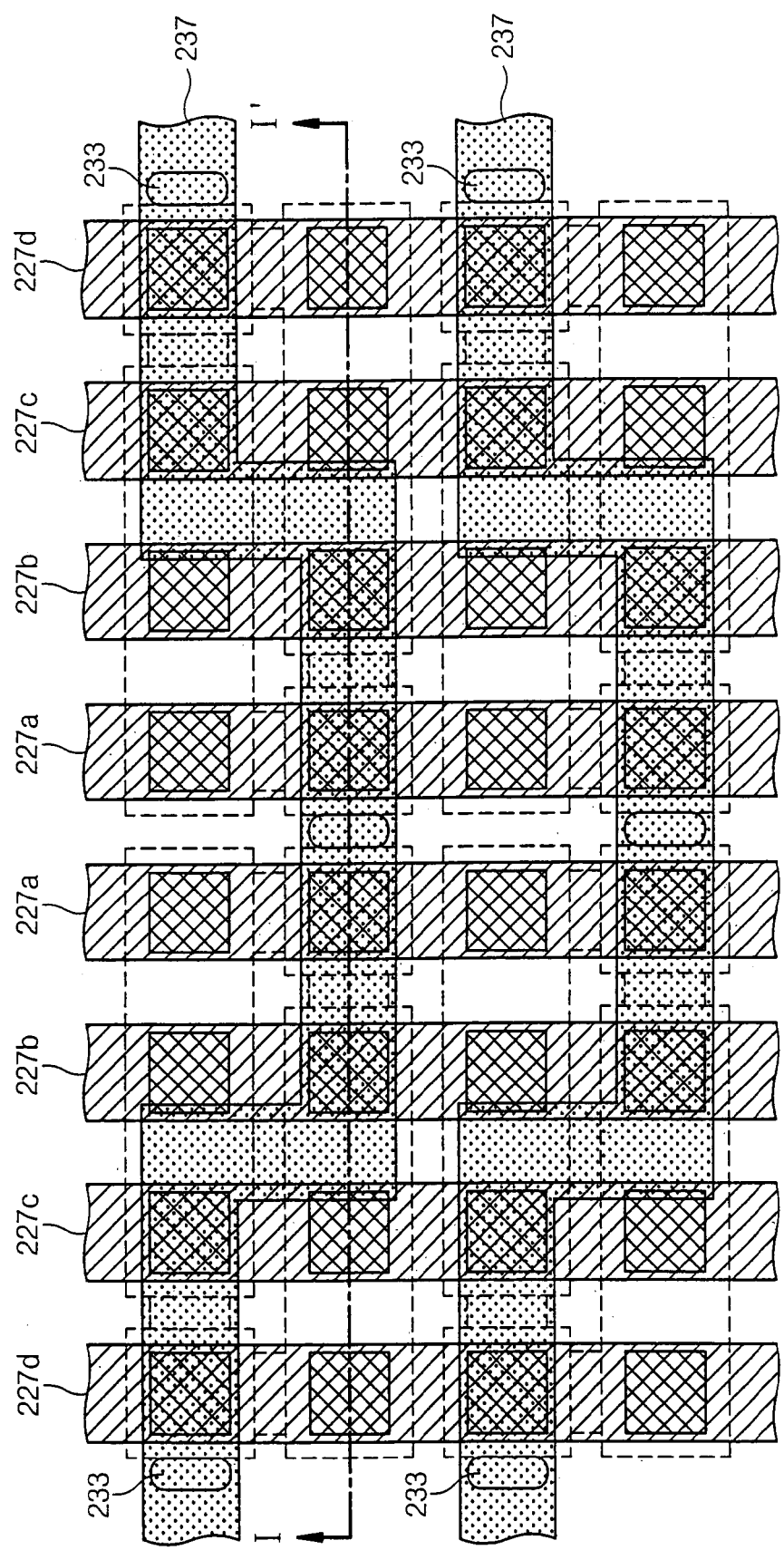
Figure 10B:
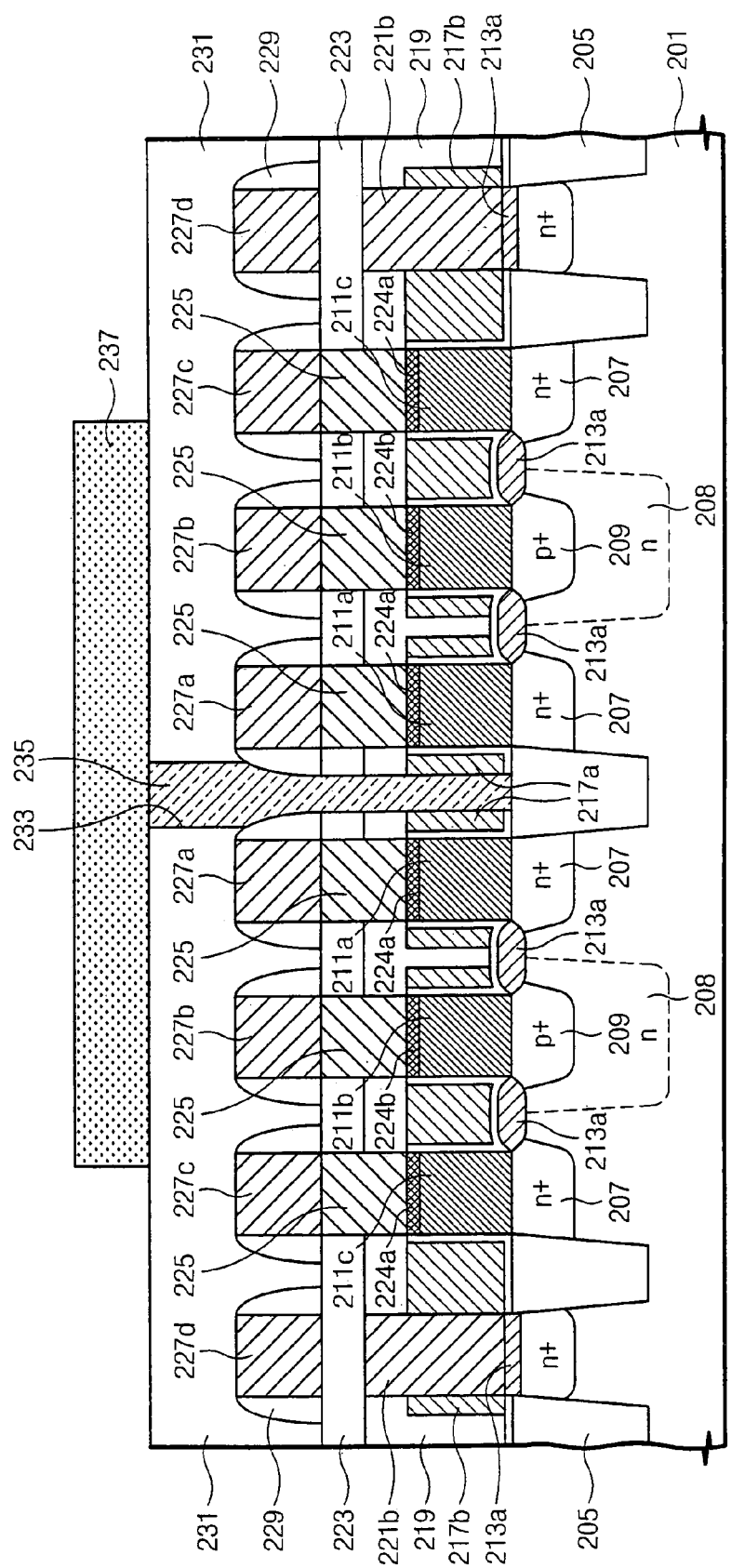

Referring now to FIGS. 10A and 10B, a conductive layer is formed on the surface of the device and in the contact hole 233 and is planarized by, for example, a CMP process to expose the third interlayer dielectric layer 231, thereby forming a word line contact plug 235. The word line contact plug 235 is commonly connected to two unit cells that are adjacent to each other. A word line conductive layer is formed on the surface of the integrated circuit substrate 201 having the word line contact plug 235, and patterned to form a word line 237.

As briefly described above with respect to FIGS. 3A through 10B, embodiments of the present invention provide SRAM cells having vertical transistors and L shaped active regions, thereby possibly decreasing an area occupied by the SRAM. Furthermore, SRAM cells according to embodiments of the present invention may also have a sufficient channel length so as not to consume a lot of power. Accordingly, SRAMs and methods of forming SRAMs according to embodiments of the present invention may provide improved SRAMs capable of being used in highly integrated devices.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A method of fabricating a unit cell of a static random access memory (SRAM) comprising:
    forming a first active region on an integrated circuit substrate, the first active region having a first portion and a second portion, the second portion being shorter than the first portion, the first portion having a first end and a second end and the second portion extending out from the first end of the first portion; and
    forming a second active region on the integrated circuit substrate, the second active region having a third portion and a fourth portion, the fourth portion being shorter than the third portion, the third portion being remote from the first portion of the first active region and having a first end and a second end, the fourth portion extending out from the second end of the third portion towards the first portion of the first active region and being remote from the second portion of the first active region.

2. The method of claim 1, wherein forming the first portion of the first active region comprises forming the first portion of the first active region perpendicular to the second portion of the first active region and parallel to the third portion of the second active region, wherein forming the third portion of the second active region comprises forming the third portion of the second active region perpendicular to the fourth portion of the second active region, wherein forming the second portion of the first active region comprises forming the second portion of the first active region parallel to the fourth portion of the second active region and wherein the first and second active regions are defined by a field oxide layer on the integrated circuit substrate.

3. The method of claim 2, further comprising:
    forming a first N-type impurity-doped region in the first portion of the first active region at the second end of the first portion;
    forming a second N-type impurity-doped region in the second portion of the first active region;
    forming a third N-type impurity-doped region in the third portion of second active region between the first and second ends of the third portion;
    forming a fourth N-type impurity-doped region in the fourth portion of the second active region;
    forming a first P-type impurity-doped region in the first portion of the first active region between the first end and the second end of the first portion and adjacent the first N-type impurity doped region; and
    forming a second P-type impurity-doped region in the third portion of the second active region at the first end of the second active region adjacent the third N-type impurity doped region.

4. The method of claim 3 wherein the first N-type impurity-doped region and third N-type impurity-doped region are aligned and wherein the first P-type impurity-doped region and second P-type impurity-doped region are aligned.

5. The method of claim 4 further comprising:
    forming first and second pillars on the first and third N-type impurity-doped regions, respectively;
    forming third and fourth pillars on the second and fourth N-type impurity-doped regions, respectively; and
    forming fifth and sixth pillars on the first and second P-type impurity-doped region, respectively.

6. The method of claim 5, further comprising:
    forming a first gate electrode on sidewalls of the third and fourth pillars; and
    forming a second gate electrode on sidewalls of the first, second, fourth and fifth pillars.

7. The method of claim 6, further comprising:
    forming first, second, third and fourth N-type pillar impurity-doped regions in an upper portion of first, second, third and fourth pillars; and
    forming fifth and sixth P-type pillar impurity doped regions in an upper portion of the fifth and sixth pillars.

8. A method of forming an SRAM cell, comprising:
    forming a field oxide layer to define a first active region having an L shape and a second active region having an inverse L shape at an integrated circuit substrate;
    forming an N-type impurity-doped region into a relatively short portion and an edge part of a relatively long portion of the first active region having the L shape, and into a relatively short portion and a middle part of a relatively long portion of the second active region having the inverse L shape;
    forming a P-type impurity-doped region into a middle part of the relatively long portion of the first active region and into an edge part of the relatively long portion of the second active region;
    forming pillars on the N-type and P-type impurity-doped regions, respectively;
    forming gate insulators on sidewalls of the pillars;
    forming a first gate electrode on the gate insulator on the sidewalls of the pillar for an access transistor and forming a second gate electrode on the gate insulator on the sidewalls of the pillars for a pull-up transistor and a driver transistor;

forming a first interlayer dielectric layer on an integrated circuit substrate having the first and second gate electrodes;

forming common connection contacts connecting to the first and second active regions through the first interlayer dielectric layer and the second gate electrode, respectively; forming a second interlayer dielectric layer on the first interlayer dielectric layer penetrated by the common connection contacts;

forming contact holes exposing the pillars by patterning the second interlayer dielectric layer;

forming N-type pillar impurity-doped regions and P-type pillar impurity-doped regions into upper parts of the exposed pillars; forming contact plugs filling the contact holes;

forming a first interconnection of a first bit line, a second interconnection of a power line, a third interconnection of a ground line and a fourth interconnection of a second bit line parallel to one another on the contact plugs;

forming a third interlayer dielectric layer on the second interlayer dielectric layer where the first through fourth interconnections are formed;

forming a word line contact plug connecting the first gate electrode through the third, second and first interlayer dielectric layers; and forming a word line connecting to the word line contact plug and orthogonal to the first through fourth interconnections.

9. The method of claim 8, wherein the pillars are formed by at least one of selectively etching the integrated circuit substrate and depositing silicon and selectively etching the silicon and a selective epitaxial growth method.

10. The method of claim 8, further comprising forming silicide layers on the pillars and on the active regions of the integrated circuit substrate before forming the gate insulator on the sidewalls of the pillars.

11. The method of claim 10, wherein the forming silicide layers comprises:

forming a thin insulation layer on the integrated circuit substrate having the pillars and on the active regions;

anisotropically etching the thin insulation layer to expose the pillars and the active regions;

forming silicide layers on the exposed pillars and on the exposed active regions; and removing the thin insulation layer.

12. The method of claim 8, wherein the contact plugs connected to the pillars are formed to have smaller size than the pillars.

13. The method of claim 8, wherein the forming a word line contact plug comprises:

forming a spacer insulator is formed on the second interlayer dielectric layer where the first through the fourth interconnections are formed;

forming spacers on sidewalls of the first through fourth interconnections by anisotropically etching the spacer insulator;

forming a third interlayer dielectric layer on the second interlayer dielectric layer where the spacers are formed;

forming a mask pattern on the third interlayer dielectric layer;

forming a contact hole to expose the first gate electrode by using the mask pattern and the spacer as etch masks;

forming a conductive layer to sufficiently fill the contact hole; and planarizing the conductive layer until the third interlayer dielectric layer.

* * * * *